United States Patent [19]

Marom et al.

[11] 4,297,704
[45] Oct. 27, 1981

[54] PHASE SENSITIVE SPECTRUM ANALYZER

[75] Inventors: Emanuel Marom, Los Angeles; Michael K. Barnoski; Richard L. Abrams, both of Pacific Palisades, all of Calif.

[73] Assignee: Hughes Aircraft Company, Culver City, Calif.

[21] Appl. No.: 66,199

[22] Filed: Aug. 13, 1979

[51] Int. Cl.³ .................. G01S 5/02; G01R 23/16; G02B 5/14; G01B 9/02
[52] U.S. Cl. ..................... 343/113 R; 324/77 K; 324/83 R; 324/96; 343/5 SA; 343/9 PS; 350/96.13; 356/349; 364/713; 364/822
[58] Field of Search ............ 324/83 R, 96, 77 K; 343/9 PS, 5 SA, 113; 350/96.13; 356/349; 364/861, 822, 713, 726, 576

[56] References Cited

U.S. PATENT DOCUMENTS

| | | | |
|---|---|---|---|
| 2,943,315 | 6/1960 | Rosenthal | 324/77 K |
| 3,221,251 | 11/1965 | Margerum et al. | 343/113 R |
| 3,280,318 | 10/1966 | Gerib et al. | 324/77 K |
| 3,942,109 | 3/1976 | Crumly et al. | 324/77 K |
| 4,110,016 | 8/1978 | Berg et al. | 350/96.13 |
| 4,133,612 | 1/1979 | Redman | 350/96.13 |

OTHER PUBLICATIONS

M. G. Cohen et al., Bell System Tech. J., Apr. 1965, p. 693.
C. F. Quate et al., Proc. of IEEE, vol. 53, No. 10, p. 1604.
Kuhn et al., IBM Tech. Disclosure Bulletin, vol. 13, No. 1, 6-1970, p. 105.
B. Chen et al., Appl. Phys. Lett., vol. 33, No. 6, 9-1978.
M. C. Hamilton et al., Opt. Eng., vol. 16, No. 5, p. 475, 9-1977.
D. L. Hecht, Opt. Eng., vol. 16, No. 5, 9-1977, p. 461.
M. K. Barnoski et al., 1978 (IEEE) Ultrasonics Symposium Proceedings, Cat. #78CH1344-1SU, p. 74.

*Primary Examiner*—S. C. Buczinski
*Attorney, Agent, or Firm*—Kenneth W. Float; William H. MacAllister

[57] ABSTRACT

Apparatus is provided comprising a laser source, collimating optics for collimating light provided by the laser source, focusing optics for focusing the collimated light provided by the collimating optics, and a detector array disposed at the focal plane of the focusing optics. Two surface acoustic wave transducers are disposed adjacent to one another and adjacent to an optical path between the collimating and focusing optics. The surface acoustic wave transducers are individually connected to antennas which are oriented substantially parallel to one another. The surface acoustic wave transducers launch surface acoustic waves which interact with the laser light and cause the light to be deflected in proportion to the amplitude and frequency of signals applied to the surface acoustic wave transducers by the antennas. The beams deflected by the two surface acoustic waves result in an interference pattern created at the detector array. A microcomputer is provided and coupled to the detector array for comparing the amplitude of the main sidelobes of the interference pattern which is indicative of the direction of arrival of energy received by the two antennas.

6 Claims, 5 Drawing Figures

U.S. Patent    Oct. 27, 1981    4,297,704
Fig. 1.
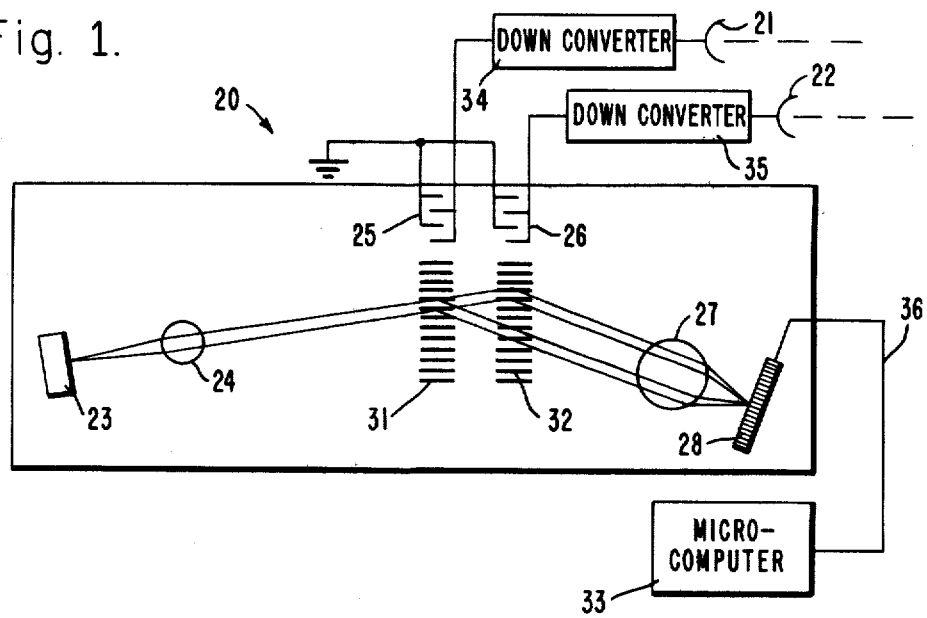
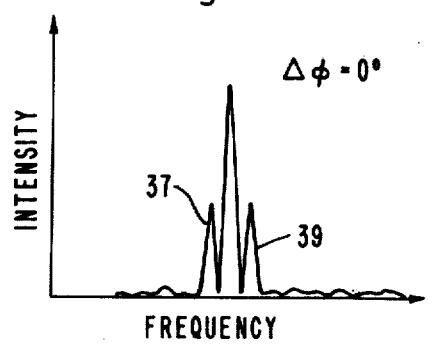
Fig. 2a.
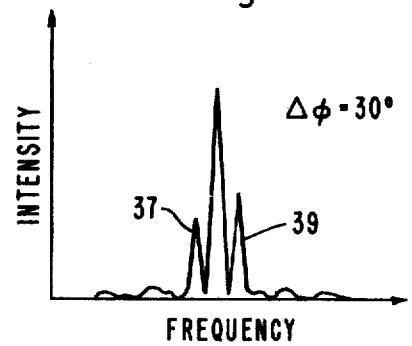
Fig. 2b.
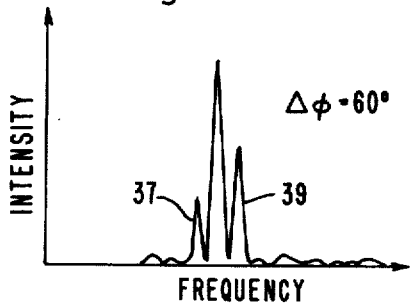
Fig. 2c.
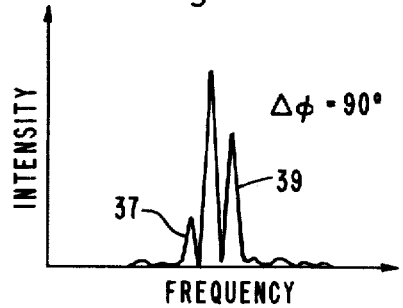
Fig. 2d.

PHASE SENSITIVE SPECTRUM ANALYZER

FIELD OF THE INVENTION

The present invention relates generally to spectrum analyzers and, more particularly, to such spectrum analyzers which incorporate integrated optics.

BACKGROUND

One function of any radar system is to accurately determine the direction of arrival of radiation emanating from a remote target. This may be accomplished by utilizing two receiving antennas and comparing either the relative amplitude or the relative phase of the energy received at the two antennas. Many prior art systems have incorporated sophisticated electronics to determine the direction of arrival. Accordingly, it is desirable to have a less complicated means by which to obtain the direction of arrival determination.

SUMMARY OF THE INVENTION

Accordingly, it is an object of the present invention to provide a spectrum analyzer disposed on an integrated circuit chip which is capable of determining both the frequency and the direction of arrival of incoming radiation.

In accordance with the present invention, there is provided a spectrum analyzer comprising a laser source and a first lens for collimating light provided by the laser source. A second lens is provided for focusing the laser light onto a detector array disposed at the focal plane thereof. Two surface acoustic wave tranducers are disposed adjacent to one another and between the first and second lenses adjacent to an optical path therebetween. The input to each transducer is separately connected to individual antennas which are disposed such that their lines of sight are substantially parallel to one another. Each transducer launches surface acoustic waves which modulate the collimated laser light provided by the first lens by means of acousto-optic Bragg interaction. As a result of this interaction, the laser light is deflected by each surface acoustic wave in proportion to the frequency of the signal applied to each transducer.

Since the two antennas are physically separated by a fixed distance, the signals applied to the two transducers will have separate phase components. Accordingly, there is a phase difference between the laser beams deflected by the respective acoustic waves of each transducer. Both deflected beams are of the same frequency but of different phase and when focused onto the detector array, this phase difference produces an interference pattern. A comparison of the intensities of the main sidelobes of the interference pattern is indicative of the direction of arrival of the incoming radiation.

The output of the detector array is applied to a microcomputer which electronically processes the detector signals and evaluates the intensity difference between the main sidelobes to obtain the phase shift of the energy applied to the antennas. Accordingly, the relative intensity of the main sidelobes give a direct measure of the electronic phase shift between the two signals, which in turn is indicative of the direction of arrival of the incoming radiation.

A specific embodiment applies the principles of the present invention to a spectrum analyzer disposed on an integrated circuit chip and fabricated by integrated optics processes. The lenses are geodesic lenses fabricated by an ultrasonic impact grinding procedure, or the like, and the laser light travels in planar integrated optic waveguides between the components of the system. The transducers set up acoustic waves in the top surface of the chip whose amplitude and frequency are functionally related to the signal applied to the tranducers by the antennas. The acoustic waves act as Bragg diffractors which interact with the laser light to diffract the light from its original path in proportion to the amplitude and frequency of the antenna signals.

BRIEF DESCRIPTION OF THE DRAWING

The foregoing and other objects and features of the present invention may be more readily understood with reference to the following detailed description taken in conjunction with the accompanying drawing, in which like reference numerals designate like structural elements, and in which:

FIG. 1 is an illustration of a signal processor made in accordance with the present invention; and FIGS. 2a through 2d represent computer simulations of intensity versus frequency curves showing the fine structure of the interference pattern developed at the detector array for various phase differences in signals applied to the transducers.

DETAILED DESCRIPTION

Referring to FIG. 1, there is shown a signal processor 20 disposed on an integrated circuit chip and made in accordance with the principles of the present invention. The chip is comprised of a substrate material, such as lithium niobate, or the like, onto which is fabricated a uniform top surface of an optically transmissive material, such as a layer of lithium niobate doped with titanium, or the like. The titanium is diffused into the substrate which causes an optical boundary layer to be formed, which in turn allows for total internal reflection of laser light within the top surface.

A laser source 23, such as a gallium aluminum arsenide laser, or the like, provides light at a particular wavelength and a particular polarization. A first geodesic lens 24 has its primary focus at the output of the laser source 23 for collimating light provided by the laser source 23. The first lens 24 is formed in the surface of the substrate by means of an ultrasonic impact grinding process, or the like, and is fabricated prior to the deposition process. A second geodesic lens 27 is provided for focusing the collimated laser light provided by the collimating lens 24. A detector array 28, which may include a CCD array therewith, is disposed at the focal plane of the second lens 27. Two surface acoustic wave transducers 25,26 are disposed between the first and second geodesic lenses 24,27, and adjacent to an optical path therebetween, and additionally, the surface acoustic wave transducers 25,26 are disposed adjacent to one another such that the respective surface acoustic waves 31,32 radiated thereby are substantially parallel to one another.

For a better understanding of this type of device, see "Design, Fabrication and Integration of Components for an Integrated Optic Spectrum Analyzer," M. K. Barnoski et al, 1978 Ultrasonics Symposium, *IEEE*, "Diffraction-limited geodesic lens for integrated optics circuits," B. Chen et al, *Appl. Phys. Lett.*, 33(6), Sept. 15, 1978, "An Integrated Optic Spectrum Analyzer," M. C. Hamilton et al, *Optical Engineering*, Vol. 16, No. 5, and "Spectrum Analyzer Using Acousto-optic Devices," O. L. Hecht, *Optical Engineering*, Vol. 16, No. 5.

Two antennas 21,22 having their lines of sight substantially parallel are connected to respective inputs of the surface acoustic wave transducers 25,26 by way of separate downconverter means 34, 35, which should preserve the phase difference between the signals provided by the antennas 21, 22. The output of the detector array 28 is connected to a microcomputer 33, or the like, by means of a cable 36, or the like.

In operation, the laser source 23 provides light of particular wavelength and particular polarization which is collimated by the first geodesic lens 24. Energy received by the antennas 21,22 is down-converted and applied to the respective surface acoustic wave transducers 25,26. The transducers 25,26 launch parallel surface acoustic waves along the top surface of the chip. The collimated laser light from the laser source 23 interacts with each surface acoustic wave 31,32 by means of a process known as Bragg interaction, which results in a single beam being deflected from each surface acoustic wave 31,32. Because the antennas 21,22 are physically separated by a fixed distance, each of the deflected beams has a different phase contribution. The two beams are focused onto the detector array 28 by means of the second geodesic lens 27. An interference pattern is formed because of the difference in phase between the two focused beams. The output of the detector array 28 is applied to the microcomputer 33 which calculates the intensity difference between the two main sidelobes generated in the interference pattern. This intensity difference is indicative of the direction of arrival of the energy received by the two antennas 21,22.

More specifically, the detector array 28 is comprised of a densly-packed serial array of detector elements in a CCD configuration, for example. The detector array 28 should have an element spacing close enough to provide for spatial resolution of the interference pattern. The output from each element is directly related to a specific frequency of energy received by the antennas 21,22. For instance, the first detector element provides a signal indicative of the frequency of energy received in a first frequency band, the second detector element provides a signal indicative of the frequency of energy received in a second frequency band, and so on, for all detector elements of the detector array 28. Thus, the frequency of the received energy is directly determined by the particular detector element output. The microcomputer 33 is programmed to scan the entire detector array 28 and to determine the presence of a signal, irrespective of the sidelobes. Control signals are provided to the detector array 28 by means of the control cable 36. Thus, the microcomputer 33 scans for a signal envelope which comprises signals provided by several detector elements. For instance, the main lobe is detected by one detector element and the two sidelobes by two adjacent elements. The detector element detecting the main lobe indicates the frequency of the received energy. A further comparison of the intensities of the sidelobes, and specifically the intensity difference between them is converted into a signal which is indicative of the direction of arrival of the incoming radiation. It is noted that in other embodiments of the invention, each element of the detector array 28 could be coupled to the microcomputer 33 by means of separate leads.

Once the elements of the detector array 28 are read in sequence and stored, the microcomputer 33 goes into a search mode to determine the location of the signals as given by this simple program:

DO I = 1, 400
SUM (I) = A(I) + A(I − 1) + A(I + 1)
IF SUM(I). LGT "Thresh" go to B(I).

The storage location B thus selects clusters of detector elements where signals are located. Now the microcomputer 33 searches for the fine structure of the signal in the vicinity of these clusters. If SUM(K) is the largest SUM in the region between (K − 2) and (K + 2), it is necessary to calculate $$\frac{A(K-1) - A(K+1)}{A(K)}.$$

This number correlates to a particular value of phase shift ($\phi$) which may be determined experimentally or by computer simulation, or the like, for any particular spectrum analyzer 20.

The phase shift ($\phi$) between the two signals, and thus the arrival direction of the radiation ($\theta$) may be obtained from the equation, $$\phi = \frac{2\pi\beta}{\alpha} \sin\theta$$

where $\alpha$ is the radiation wavelength of the detected signal, and $\beta$ is the distance between the two antenna elements.

Referring now to FIG. 2, there is shown intensity versus frequency curves obtained from a computer simulation which show the fine structure of the interference pattern generated by the two beams as detected by the detector array 28. FIGS. 2a through 2d show the fine structure patterns which are indicative of 0°, 30°, 60° and 90° phase differences, respectively, between the two focused beams. Accordingly, a comparison of the intensities of the main sidelobes 37 and 39 gives an indication of the direction of arrival of the radiation received by the two antennas 21,22 to within an accuracy of about 15%.

Thus, there has been described an improved integrated optic spectrum analyzer disposed on an integrated circuit chip for use in radar application which is capable of determining the direction of arrival of energy received by the antennas thereof.

It is to be understood that above-described embodiment is merely illustrative of but one of the many possible specific embodiments which can represent applications of the principles of the present invention. Numerous and varied other arrangements can readily be devised in accordance with these principles by those skilled in the art without departing from the spirit and scope of the invention.

What is claimed is:

1. An acousto-optic processing arrangement which determines the direction of arrival of energy applied thereto, said arrangement comprising:
   a laser source;
   a first lens disposed to collimate laser light provided by said laser source;
   a second lens disposed to focus the collimated laser light provided by said first lens;
   a detector array disposed at the focal plane of said second lens;
   two surface acoustic wave transducers disposed between said first and second lenses and adjacent to an optical path between said lenses, said two surface acoustic wave transducers being disposed adjacent to one another and disposed such that the surface acoustic waves radiated thereby are substantially parallel to one another;

two antennas, each antenna being individually coupled by means of separate downconverters to one of said surface acoustic wave transducers, said antennas being disposed so as to have their respective lines-of-sight substantially parallel to one another; and computer means coupled to said detector array for determining the direction of arrival of said applied energy.

2. An acousto-optic processing arrangement which determines the direction of arrival of energy of energy applied thereto, said arrangement comprising:

a laser source;

a first lens disposed to focus the collimated laser light provided by said first lens;

a detector array disposed at the focal plane of said second lens;

two surface acoustic wave transducers disposed between said first and second lenses and adjacent to an optical path between said lenses, said two surface acoustic wave transducers being disposed adjacent to one another and disposed such that the surface acoustic waves radiated thereby are substantially parallel to one another;

two antennas, each antenna being individually coupled by means of separate downconverters to one of said surface acoustic wave transducers, said antennas being disposed so as to have their respective lines-of-sight substantially parallel to one another; and computer means coupled to said detector array for determining the direction of arrival of said applied energy;

whereby in response to energy applied to said two transducers, said arrangement provides signals which are indicative of the direction of arrival of said applied energy.

3. An acoustic-optic processing arrangement for determining the direction of arrival of energy applied thereto, said arrangement comprising:

a laser source;

an integrated circuit chip having a surface layer capable of transmitting light from said laser source, disposed to receive light from said laser source;

a first lens disposed in said surface layer to collimate laser light provided by said laser source;

a second lens disposed in said surface layer to focus the collimated laser light provided by said first lens;

a detector array disposed at the focal plane of said second lens;

two surface acoustic wave transducers disposed between said first and second lenses on said surface and adjacent to an optical path between said lenses, said two surface acoustic wave transducers being disposed adjacent to one another and disposed such that the surface acoustic waves radiated thereby are substantially parallel to one another;

two antennas, each antenna being individually coupled by means of separate downconverters to one of said surface acoustic wave transducers, said antennas being disposed so as to have their respective lines-of-sight substantially parallel to one another; and computer means coupled to said detector array for determining the direction of arrival of said applied energy.

4. An acousto-optic processing arrangement for determining the direction of arrival of energy applied thereto, said arrangement comprising:

a laser source;

an integrated circuit chip having a surface layer capable of transmitting light from said laser source, disposed to receive light from said laser source;

a first lens disposed in said surface layer to collimate laser light provided by said laser source;

a second lens disposed in said surface layer to focus the collimated laser light provided by said first lens;

a detector array disposed at the focal plane of said second lens;

two surface acoustic wave transducers disposed between said first and second lenses on said surface and adjacent to an optical path between said lenses, said two surface acoustic wave transducers being disposed adjacent to one another and disposed such that the surface acoustic waves radiated thereby are substantially parallel to one another;

two antennas, each antenna being individually coupled by means of separate downconverters to one of said surface acoustic wave tranducers, said antennas being disposed so as to have their respective lines-of-sight substantially parallel to one another; and computer means coupled to said detector array for determining the direction of arrival of said applied energy;

whereby in response to energy applied to said two transducers, said arrangement provides signals which are indicative of the direction of arrival of said applied energy.

5. The arrangements of claims 1, 2, 3 or 4 wherein said surface acoustic wave transducers respond to signals provided by said two antennas and launch surface acoustic waves which interact with said laser light and cause two diffracted light beams which are indicative of the phase difference in the energy received by said two antennas, said two diffracted light beams being focused onto said detector array so as to cause an interference pattern having at least two main sidelobes, said computer means providing a means by which to compare the relative intensities of said two main sidelobes and provide a signal which is indicative of the direction of arrival of said energy received by said two antennas.

6. An acoustic-optic processing arrangement including:

an integrated optic spectrum analyzer disposed on an integrated circuit chip, said spectrum analyzer comprising a laser source, a first lens disposed so as to collimate laser light provided by said laser source, a second lens disposed so as to focus light transmitted by said first lens, a detector array disposed at the focal plane of said second lens for converting optical signals into electrical signals, and a first acoustic wave transducer disposed between said first and second lenses adjacent to an optical path therebetween, wherein the improvement comprises:

a second acoustic wave transducer disposed between said first and second lenses adjacent to said optical path and adjacent to said first acoustic wave transducer such that acoustic waves provided thereby are substantially parallel to acoustic waves provided by said first acoustic wave transducer, the acoustic waves provided by said first and second transducers substantially interacting with light provided by said laser source so as to provide two separately diffracted beams therefrom, said diffraction being a function of the amplitude and frequency of input signals applied to said transducers, said two beams causing an interference pattern having at least two main sidelobes in the signals provided by said detector array, the relative intensities of said two main sidelobes being indicative of the relative phase difference between the signals applied to said two surface acoustic wave transducers;

two antennas having their respective lines-of-sight orieted substantially to one another and having their outputs coupled to respective inputs of said first and second surface acoustic wave transducers by means of separate downconverters, said antennas providing said applied signals to said surface acoustic wave transducers; and computer means coupled to said detector array for determining the direction of arrival of energy applied to said arrangement.

* * * * *